United States Patent
Parlow et al.

(10) Patent No.: US 9,917,454 B2
(45) Date of Patent: Mar. 13, 2018

(54) INSTRUMENT PANEL STORAGE SYSTEM INCORPORATING A REMOVABLE STORAGE BIN

(71) Applicant: FORD GLOBAL TECHNOLOGIES, LLC, Dearborn, MI (US)

(72) Inventors: Kathleen M. Parlow, Columbus, MI (US); Nicholas Alphonse Billardello, Macomb, MI (US); Scott Holmes Dunham, Redford, MI (US); Elizabeth Cleary Johnston Tengler, Grosse Pointe Park, MI (US); Cornel Lewis Gardner, Romulus, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 436 days.

(21) Appl. No.: 14/594,655

(22) Filed: Jan. 12, 2015

(65) Prior Publication Data
US 2016/0204634 A1    Jul. 14, 2016

(51) Int. Cl.
*H02J 7/00* (2006.01)
*H05K 5/00* (2006.01)
*B60R 7/06* (2006.01)

(52) U.S. Cl.
CPC ............ *H02J 7/0044* (2013.01); *B60R 7/06* (2013.01); *H02J 7/0052* (2013.01); *H05K 5/0073* (2013.01); *H02J 2007/0062* (2013.01)

(58) Field of Classification Search
USPC ........................................................ 320/114
See application file for complete search history.

(56) References Cited

U.S. PATENT DOCUMENTS

| | | | |
|---|---|---|---|
| 6,095,060 A * | 8/2000 | Ma ........................ | B60N 3/002 108/44 |
| 6,116,674 A | 9/2000 | Allison et al. | |
| 7,104,580 B2 * | 9/2006 | Clark ................... | B60N 2/4686 296/24.32 |
| 7,429,068 B2 | 9/2008 | Busha et al. | |
| 2005/0189776 A1 * | 9/2005 | Sturt ..................... | B60N 3/107 296/24.34 |
| 2008/0169667 A1 | 7/2008 | Siniarski et al. | |
| 2009/0013357 A1 * | 1/2009 | Cassellia ................ | B60K 35/00 725/75 |
| 2013/0154555 A1 * | 6/2013 | Miller ................... | H02J 7/0042 320/108 |
| 2014/0152238 A1 * | 6/2014 | Racenet ................ | H02J 7/0042 320/107 |
| 2014/0239663 A1 | 8/2014 | Sandhu et al. | |

* cited by examiner

*Primary Examiner* — Robert Grant
(74) *Attorney, Agent, or Firm* — Vichit Chea; King & Schickli, PLLC

(57) ABSTRACT

An instrument panel storage system is provided for a motor vehicle. That storage system includes an instrument panel having a storage cavity defining a first docking station and a removable storage bin held in the cavity at the first docking station. Further the storage system includes one or more remote docking stations that allow the removable storage bin to be positioned at different locations within the motor vehicle as desired by the vehicle occupants.

13 Claims, 10 Drawing Sheets

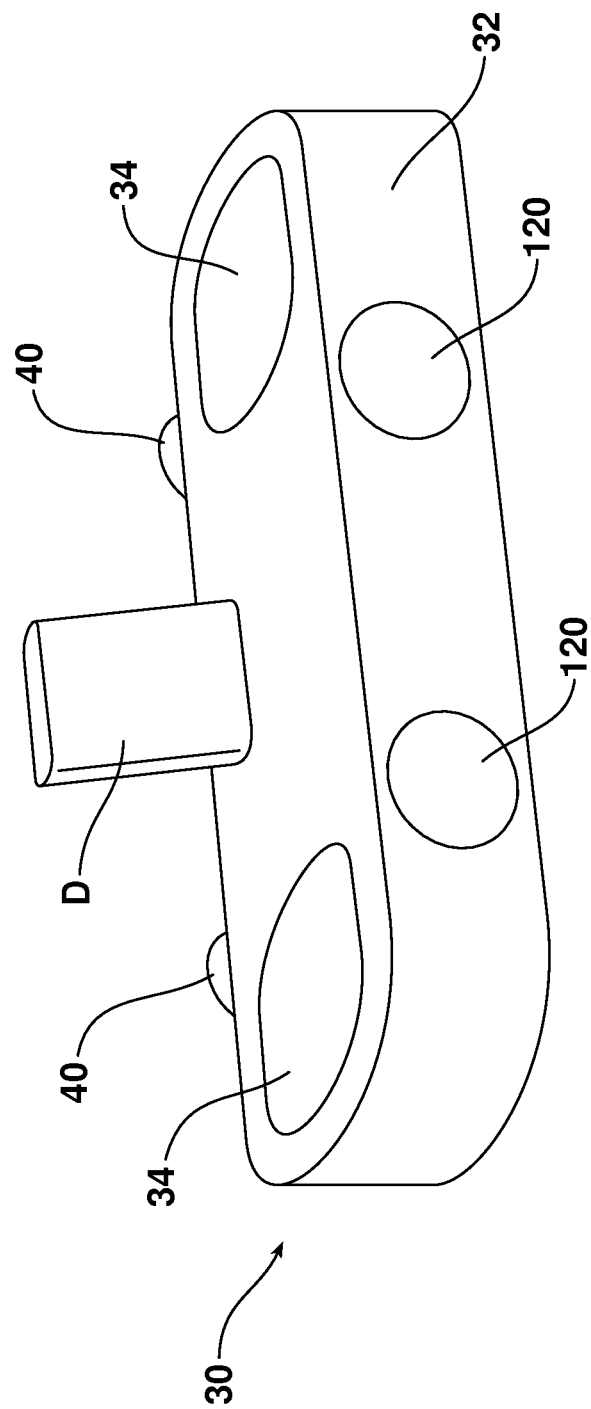

INSTRUMENT PANEL STORAGE SYSTEM INCORPORATING A REMOVABLE STORAGE BIN

TECHNICAL FIELD

This document relates generally to interior trim components for a motor vehicle and, more particularly, to an instrument panel storage system incorporating a removable storage bin having a docking feature which allows the bin to be secured at other locations within the vehicle.

BACKGROUND

Motor vehicle users are always looking for convenient places to store and hold personal items such as wallets, cell phones, electronics, flashlights, sports equipment such as golf balls, suntan lotion, eye drops and the like. In many cases the typical storage options designed into motor vehicles, including, for example, glove boxes, console bins, console cup holders, instrument panel, center stack storage compartments, door map pockets, seatback pockets and the like either do not provide enough dedicated storage or are simply not versatile enough to provide the best possible option. Further, these dedicated storage options are typically fixed and non-configurable to best meet the needs of the user. In addition, most are focused upon storage within reach of the driver or front row passenger and are not conveniently available to rear seat occupants. As a result it is clear that a need exists for additional storage options in the interior trim of a motor vehicle.

SUMMARY

In accordance with the purposes and benefits described herein, an instrument panel storage system is provided for a motor vehicle. That storage system comprises an instrument panel including a storage cavity defining a first docking station and a removable storage bin held in the cavity at the first docking station. More specifically, the storage bin includes a docking feature for mating connection with the first docking station.

In addition the storage system includes a second docking station within the motor vehicle remote from the instrument panel. The docking feature on the storage bin also mates with this second docking station thereby providing the versatility of being able to be secured at two different locations within the motor vehicle as desired by the individuals riding therein.

In one possible embodiment, the docking feature includes a depending tab. In one possible embodiment, the docking feature includes a suction cup. In one possible embodiment, the docking feature includes both a depending tab and a suction cup. In this embodiment, the second docking station may comprise a vehicle door. More specifically, the depending tab is received between an interior door panel and a door window while the suction cup engages the door window to thereby secure the storage bin in position.

In one possible embodiment, the storage bin includes a cover. The cover may comprise a hinged lid. In another possible embodiment, that cover may comprise a retractable cover such as one including a pull tab and a payout reel. In one possible embodiment, that retractable cover may be made from a netting material. In one possible embodiment, that cover is made from elastic material so as to be able to stretch over items one might wish to store in the storage bin that are taller than the bin. In another possible embodiment, the cover is transparent. In one possible embodiment, the storage bin includes a charging station for an electrical device such as a cell phone, navigation device or music device.

In one possible embodiment, the storage cavity in the instrument panel includes a top wall, a bottom wall, an open front and a stepped rear wall. That stepped rear wall may include a first step having a slot defining a first docking station. The bottom wall includes a channel. The docking feature on the storage bin includes a depending tab and a suction cup. The depending tab may be received in the slot and the suction cup may engage the upper portion of the stepped rear wall of the storage cavity.

In accordance with an additional aspect, a storage bin is provided for a motor vehicle. That storage bin comprises a body including a storage compartment and a docking feature. In one possible embodiment, that docking feature includes a depending tab and a suction cup.

In the following description, there are shown and described several preferred embodiments of the instrument panel storage system. As it should be realized, the instrument panel storage system is capable of other, different embodiments and its several details are capable of modification in various, obvious aspects all without departing from the instrument panel storage system as set forth and described in the following claims. Accordingly, the drawings and descriptions should be regarded as illustrative in nature and not as restrictive.

BRIEF DESCRIPTION OF THE DRAWING FIGURES

The accompanying drawing figures incorporated herein and forming a part of the specification, illustrate several aspects of the instrument panel storage system and together with the description serve to explain certain principles thereof. In the drawing figures:

FIG. 8 is a detailed perspective view of still another storage bin incorporating a speaker system.

Reference will now be made in detail to the present preferred embodiments of the instrument panel storage system, examples of which are illustrated in the accompanying drawing figures.

DETAILED DESCRIPTION

Figure 1:
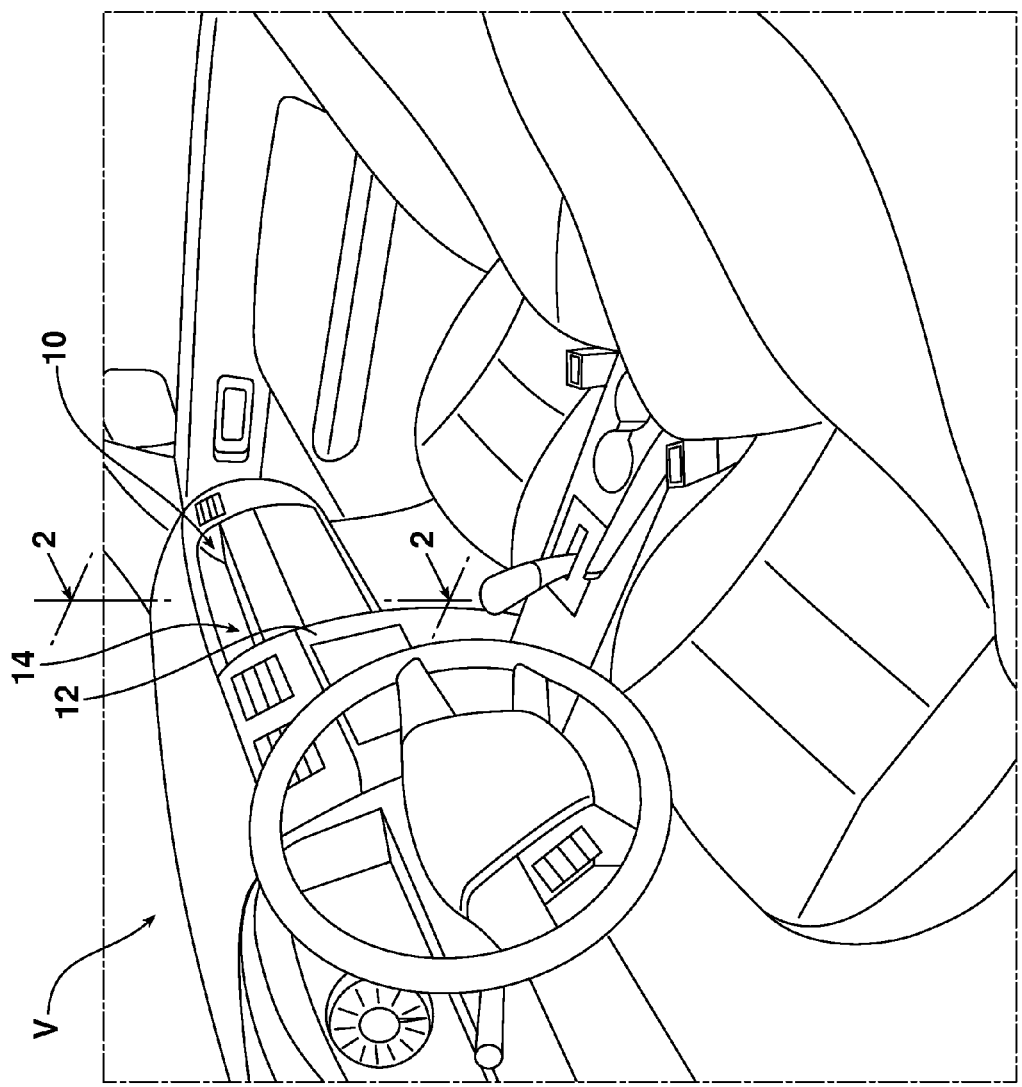
FIG. 1 is a perspective view of the interior of a motor vehicle incorporating the instrument panel storage system that is the subject of this document.
Figure 2:
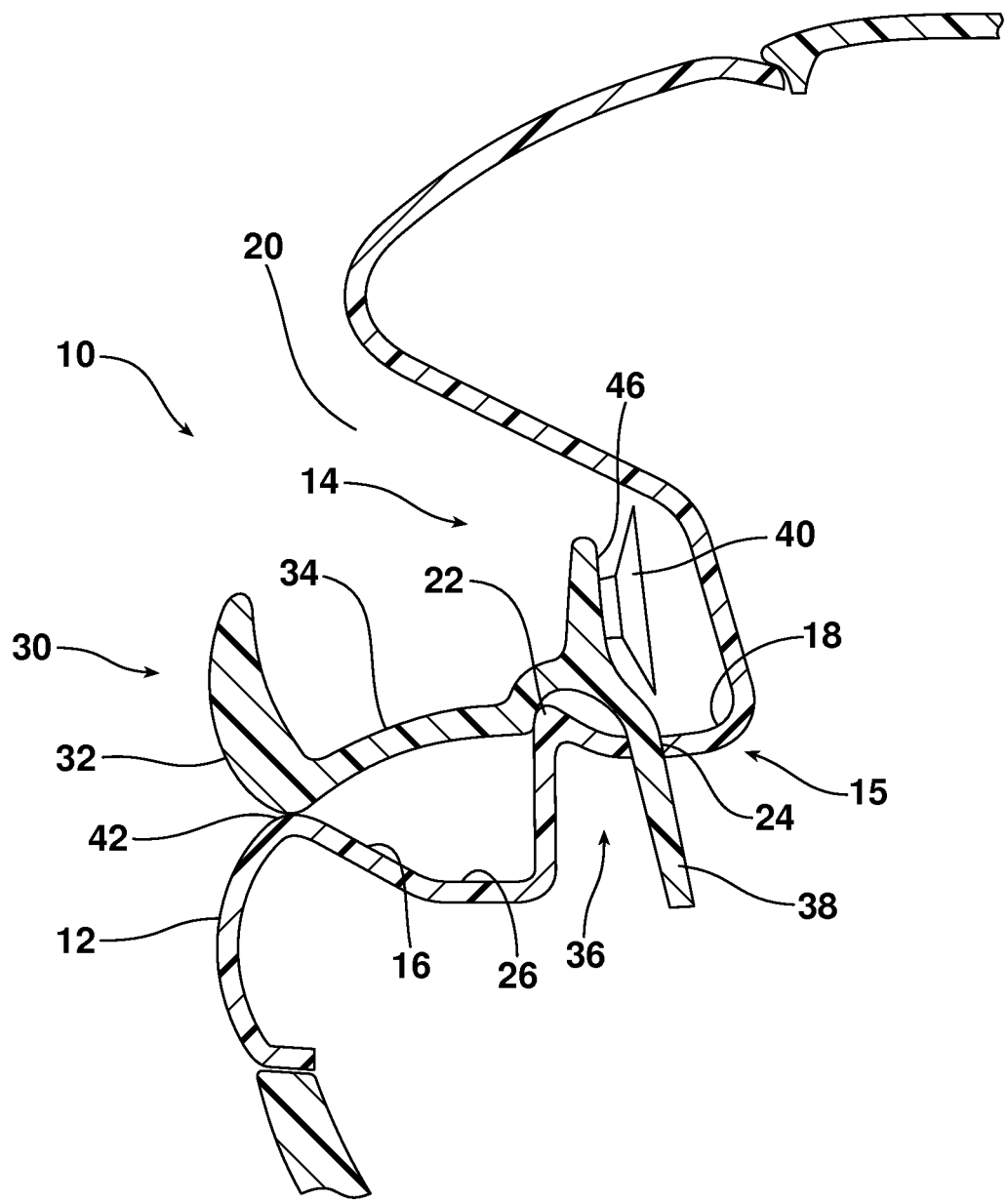
FIG. 2 is a schematic cross-sectional view taken along line 2-2 in FIG. 1 illustrating how the removable storage bin is received and held in the storage cavity of the instrument panel.

Reference is now made to FIG. 1 illustrating the interior of the motor vehicle V incorporating the instrument panel storage system 10. As illustrated in FIGS. 1 and 2, the instrument panel storage system 10 includes an instrument panel 12 including a storage cavity 14. The storage cavity 14 includes a bottom wall 16, a stepped rear wall 18 and an open front 20. The stepped rear wall 18 defines a first docking station 15 including a step 22 and a slot 24. The bottom wall 16 includes a channel 26.

A removable storage bin 30 is held in the storage cavity 14 at the first docking station 15. As illustrated, the storage bin 30 includes a body 32 that defines a storage compartment 34. Further, the body 32 includes a docking feature 36. In the illustrated embodiment, that docking feature 36 takes the form of one or more depending tabs 38 and one or more suction cups 40. The depending tabs 38 may be directed in a first direction while the suction cups 40 are directed in a second direction. In the illustrated embodiment the first and second directions are substantially perpendicular to one another.

As best illustrated in FIG. 2, the docking feature 36 is mated with the first docking station 15 in order to secure the storage bin 30 in the storage cavity 14. More specifically, the depending tab 38 is inserted in the slot 24 in the first step 22 while the body 32 of the storage bin is otherwise supported on the first step 22 and the front lip 42 of the bottom wall 16. In the illustrated embodiment, the suction cup 40 is held in a space between the rear wall 46 of the bin 30 and the stepped rear wall 18 of the storage cavity 14. In another possible embodiment, the suction cup 40 may engage that rear wall 18 if desired.

As should be appreciated, when the storage bin 30 is seated in the storage cavity 14 of the instrument panel 12, the open top of the storage compartment 34 may be easily accessed so that one may put any item he wants into the storage compartment 34 including, for example, pens, pencils, golf balls or other small items and even electronic devices such as a navigation device, a cell phone or a music device such as an MP3 player or iPod.

Figure 2A:
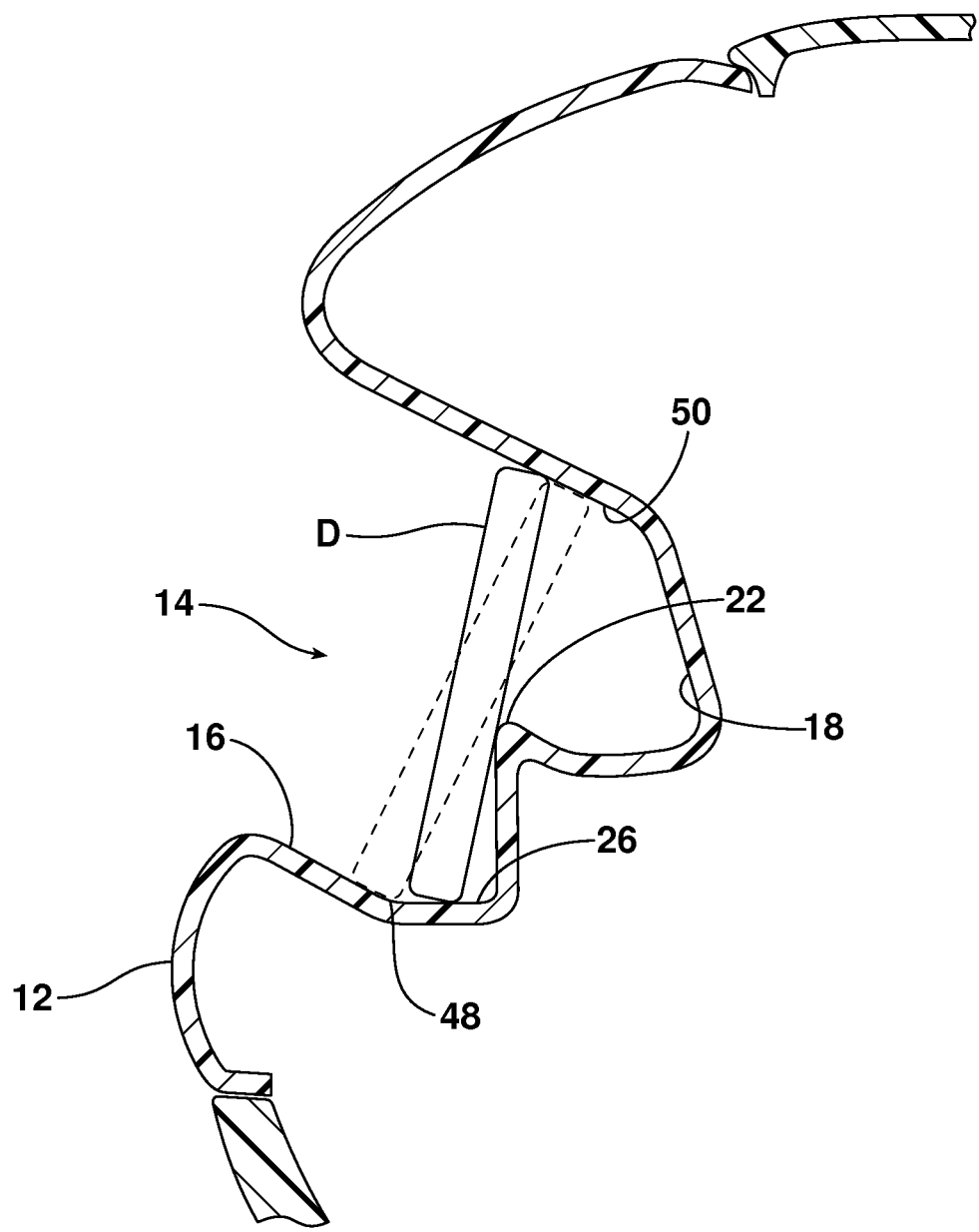
FIG. 2a is a cross-sectional view taken along line 4-4 in FIG. 3 illustrating how an electronic device such as a cell phone or navigation device may still be held in the storage cavity of the instrument panel when the storage bin has been removed from that cavity.

As illustrated in FIG. 2a, the storage bin 30 may be removed from the storage cavity 14 if desired. When this is done, it should be appreciated that the storage cavity 14 still functions as a storage compartment. More specifically, one or more items may be placed in the channel 26 formed in the bottom wall 16. Further, as illustrated in FIG. 2a, an electronic device D, such as a cell phone, navigation device or music device may be positioned in the storage cavity 14. In the illustrated embodiment, the lower edge of the device D rests in the front corner 48 of the channel 26 while the upper edge rests against the upper portion 50 of the stepped rear wall 18. As should be appreciated, the step 22 engages the rear of the device just below the center line and acts as a prop allowing the angle of the device D within the cavity 14 to be adjusted as desired (note full line and phantom line positions of device in the FIG. 2a illustration).

Figure 3:
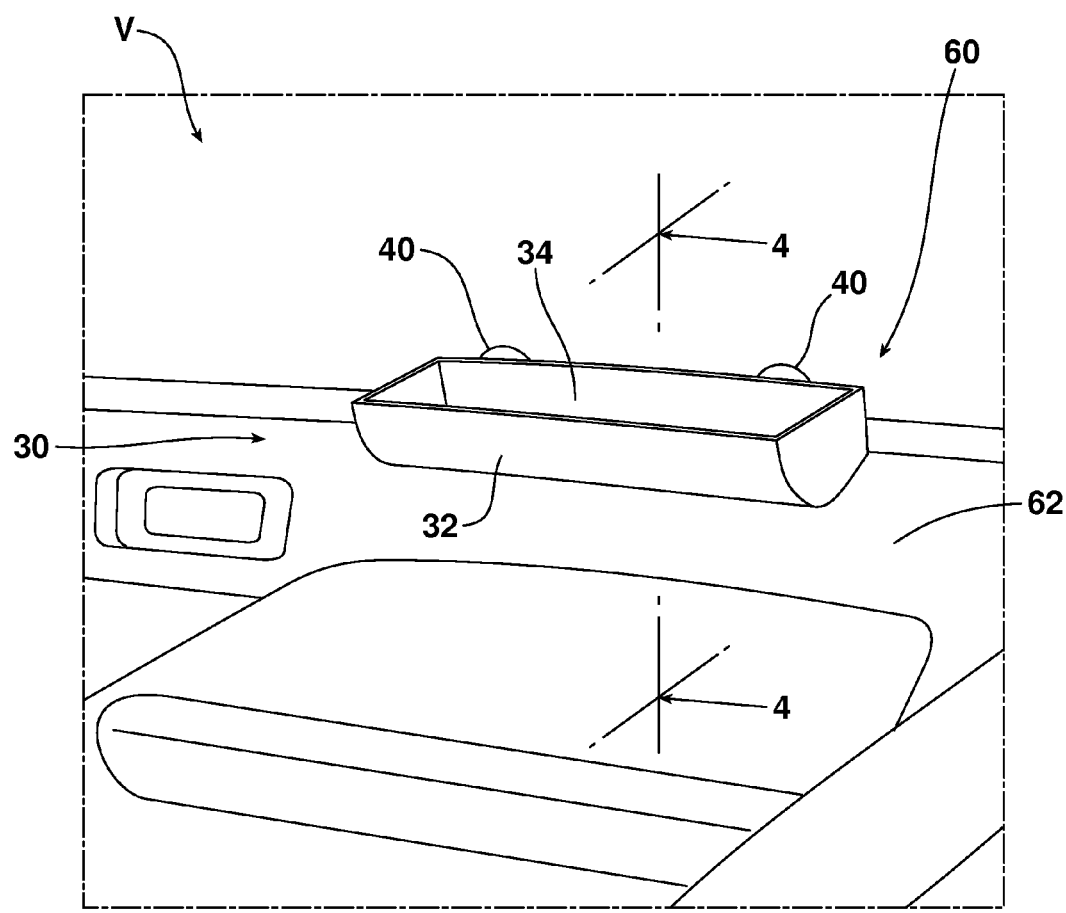
FIG. 3 is a perspective view illustrating how the storage bin may be mounted along the beltline of a rear door of the motor vehicle.
Figure 4:
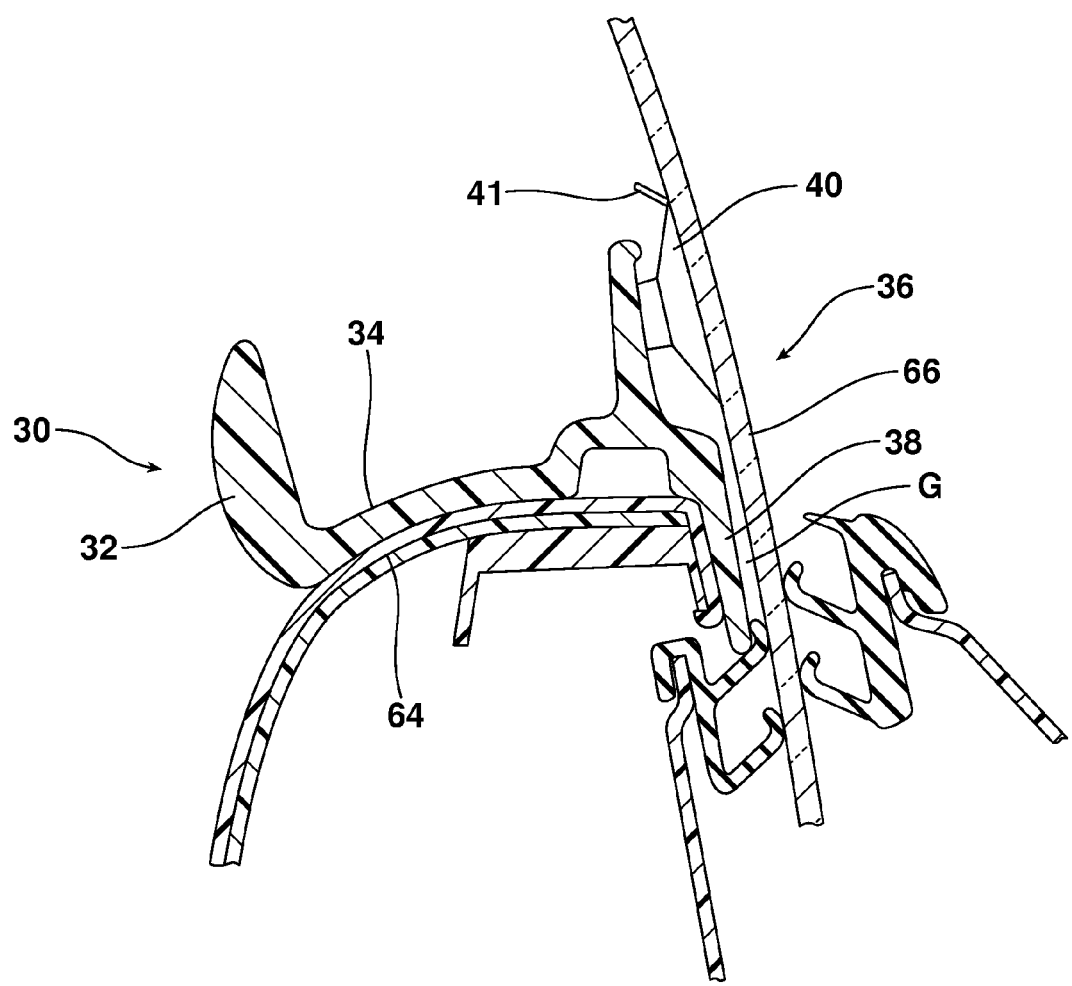
FIG. 4 is a cross-sectional view illustrating how the storage bin is mounted to or docked at a second docking station comprising a beltline area of the rear door.

When the storage bin 30 is removed from the storage cavity 14 of the instrument panel 12, it should be appreciated that the storage bin may be mounted or docked with a second docking station 60 located within the motor vehicle V at another location remote from the instrument panel 12. As illustrated in FIGS. 3 and 4, that second docking station 60 may be provided at the beltline of a rear door 62 of the motor vehicle V. More specifically as illustrated in FIG. 4, the removable storage bin 30 is positioned so that the body 32 rests along the top edge of the door panel rollover 64 with the depending tab 38 inserted into a gap G between the door panel rollover and the door window glass 66. Further, the suction cup 40 is brought into engagement and sticks to the door window glass 66 so that the storage bin 30 is held in a stable position on top of the door panel rollover 64. This is a very convenient location that may be easily accessed by an individual seated in the rear seat of the motor vehicle V. As illustrated, the suction cup 40 may include a pull tab 41 to aid in releasing the suction cup from the window glass 66 when desired.

As should be appreciated, the removable storage bin 30 may be secured along the beltline on top of the door panel rollover 64 of any of the doors in the motor vehicle. Thus, the removable storage bin 30 is particularly versatile and can provide for storage at a number of different locations so as to better meet the needs of the vehicle occupants and, therefore, is useful for any number of particular applications. Further, it should be appreciated that the second remote docking station 60 may also be provided at other positions in the vehicle besides the beltline at the door panel rollover 64. For example, a docking station 60 including a concavity and cooperating slot for the depending tab 38 may be provided substantially anywhere on the interior trim panels of the vehicle including, for example, along the rear fender well panels of a station wagon or SUV behind the rear seat. Further, a remote docking station 60 could be provided along the rear face of the front console, in the rear face of a front seat or rear seat and at substantially any other location desired by the vehicle manufacturer to thereby increase the versatility of the storage system 10.

Figure 5A:
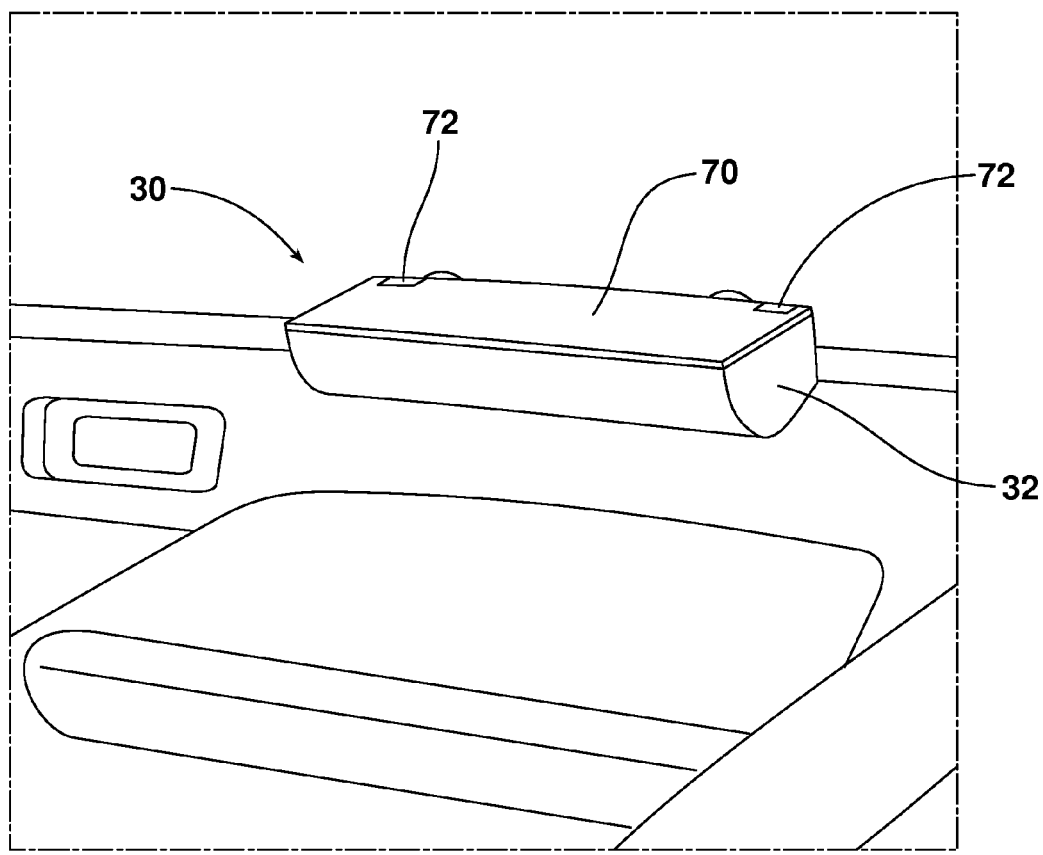
FIGS. 5a and 5b are perspective views illustrating the optional hinged cover for the storage bin illustrated in respective closed and open positions.
Figure 5B:
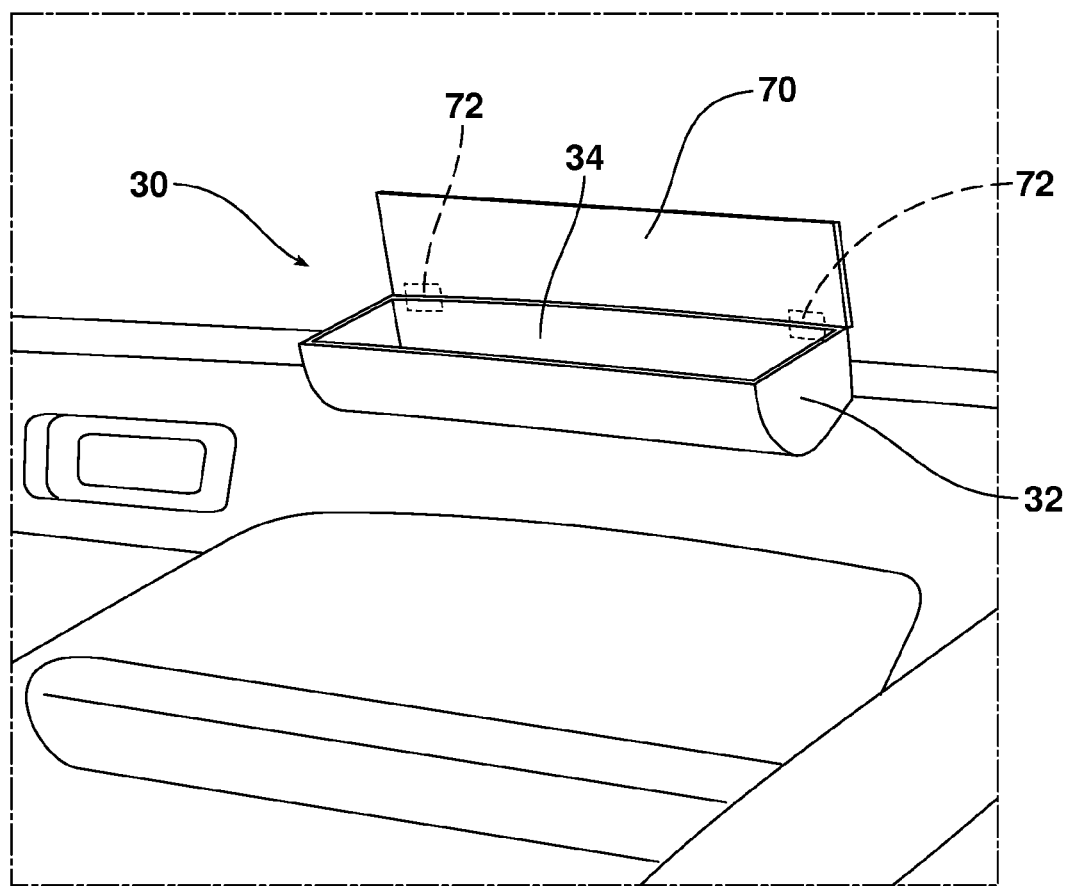

It should be appreciated that the removable storage bin 30 may incorporate a number of optional features. For example, as illustrated in FIGS. 5a and 5b the opening in the body 32 allowing access to the storage compartment 34 may be closed by a hinged lid 70 secured to the body by a friction type or other appropriate hinge 72.

Figure 6A:
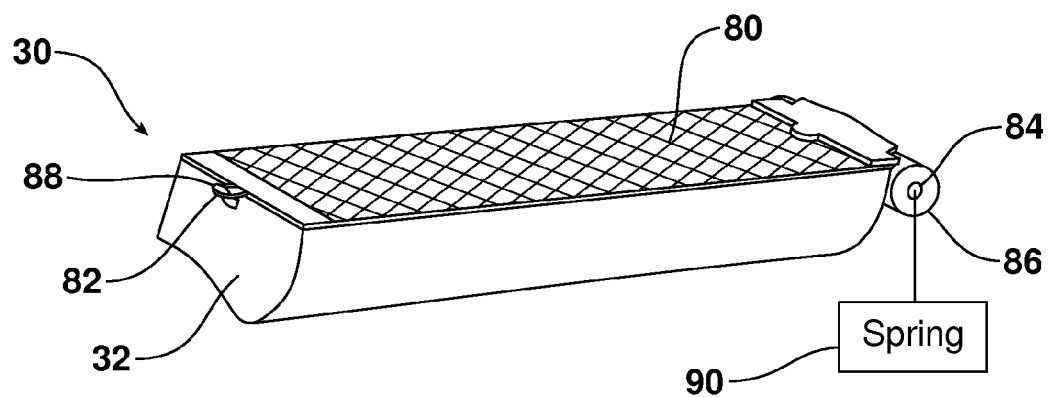
FIGS. 6a and 6b are detailed perspective views illustrating the optional retractable cover in the closed and opened positions.
Figure 6B:
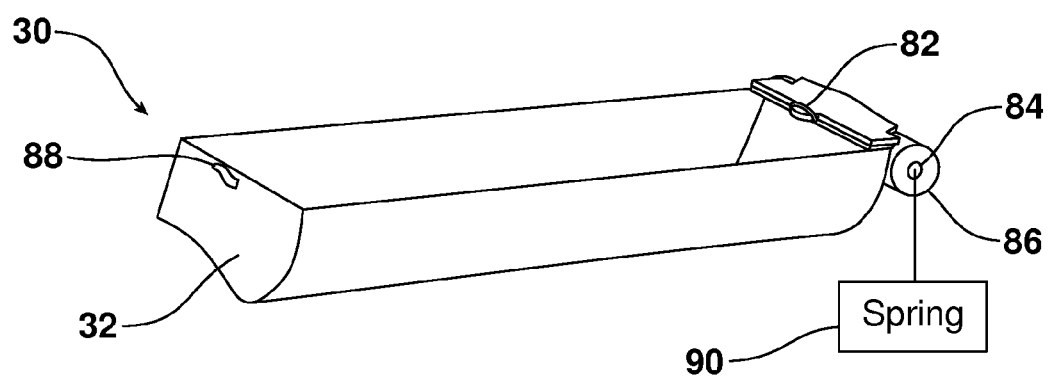

Further, as illustrated in FIGS. 6a and 6b, the opening in the body 32 may also be closed by a retractable cover 80. In the illustrated embodiment the retractable cover 80 comprises an elastic netting material which can be stretched over items held in the storage bin that are taller than the sidewalls of the bin and thereby positively and securely hold those items. As should be appreciated, the cover may include a tab 82 and a payout reel 84. When the storage bin 30 is open, the retractable cover 80 is stored on the payout reel 84 in a reel compartment 86 at one end of the bin. When it is desired to close the storage compartment 34 in the storage bin 30, one engages the pull tab 82 and unwinds the cover 80 from the payout reel 84. As should be appreciated the pull tab 82 includes a loop that is positioned over a catch 88 at the end of the bin 30 opposite the reel compartment 86 in order to hold the cover 80 in the closed position. When one wishes to subsequently open the storage bin 30, one removes the pull tab loop 82 from the catch 88 and the torsion spring 90 on the payout reel retracts the cover 80 back onto the payout reel 84.

Figure 7:
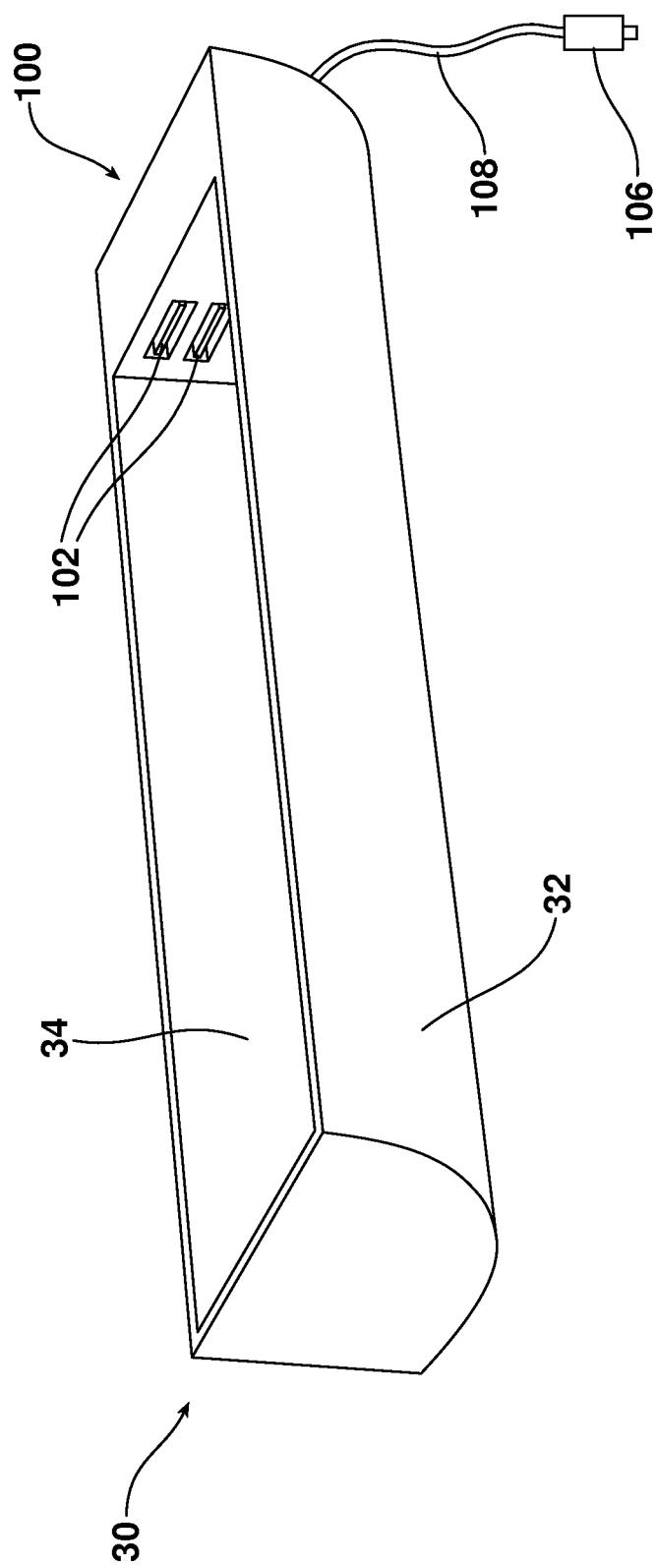
FIG. 7 is a detailed perspective view of the storage bin incorporating the optional charging station for the charging of the electronic devices that might be held in the storage bin.

As further illustrated in FIG. 7, the storage bin 30 may also incorporate a charging station 100. Charging station 100 may include one or more charging ports, such as USB ports 102. In the illustrated embodiment, a plug 106 and cooperating cord 108 are provided so that the USB ports 102 may be connected to a power source within the motor vehicle. In an alternative embodiment, the docking station 25/60 includes a power source and the bin 30 includes an integral plug that is secured in that power source whenever the removable storage bin 30 is secured at the docking station.

In yet another embodiment illustrated in FIG. 8, the storage bin incorporates a speaker system 120 and is especially adapted to receive and hold a music device D to play music through the speaker system.

In summary, the instrument panel storage system 10 provides a number of benefits and advantages. By incorporating a removable storage bin 30 with a docking feature 36 capable of docking with multiple docking stations 15/60 positioned throughout the motor vehicle, great versatility is provided. As a result, a storage bin 30 may be positioned at a location that is particularly suited for substantially any conceivable application of a vehicle occupant. Further, a storage bin 30 may be equipped with various features to meet the needs for any particular application. In fact, a manufacturer may provide storage bin accessories and additional storage bin designs in the aftermarket. All such storage bins 30 would incorporate the docking feature 36 necessary to allow them to dock and connect with any of the docking stations 15/60 provided in the motor vehicle.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled.

What is claimed:

1. An instrument panel storage system for a motor vehicle, comprising:
   an instrument panel including a storage cavity defining a first docking station;
   a second docking station within the motor vehicle remote from said instrument panel; and
   a removable storage bin including a docking feature for mating connection with said first docking station or said second docking station, wherein said docking feature includes a depending tab and a suction cup, and wherein said depending tab is received between an interior door panel and a door window and said suction cup engages said door window.

2. The system of claim 1, wherein said second docking station is a vehicle door.

3. The system of claim 1, wherein said storage bin includes a cover.

4. The system of claim 3, wherein said cover is a hinged lid.

5. The system of claim 3, wherein said cover is retractable.

6. The system of claim 5, wherein said retractable cover includes a pull tab and a payout reel.

7. The system of claim 6, wherein said retractable cover is made from a netting material.

8. The system of claim 7, wherein said netting is elastic.

9. The system of claim 3, wherein said cover is transparent.

10. The system of claim 1, wherein said removable storage bin includes a charging station for an electrical device.

11. The system of claim 1, wherein said storage cavity includes a top wall, a bottom wall, an open front and a stepped rear wall.

12. The system of claim 11, wherein said stepped rear wall includes a first step having a slot defining said first docking station and said bottom wall includes a channel.

13. The system of claim 12, wherein said depending tab is received and held in said slot of said first step.

* * * * *